United States Patent
Lin et al.

(10) Patent No.: US 11,638,369 B2
(45) Date of Patent: Apr. 25, 2023

(54) HEAT DISSIPATING MECHANISM AND DISPLAY APPARATUS THEREOF

(71) Applicant: Wistron Corporation, New Taipei (TW)

(72) Inventors: Chun-Yi Lin, New Taipei (TW); Chien-Tsung Lee, New Taipei (TW); Cheng-Wei Lin, New Taipei (TW); Jen-Kung Li, New Taipei (TW)

(73) Assignee: Wistron Corporation, New Taipei (TW)

( * ) Notice: Subject to any disclaimer, the term of this patent is extended or adjusted under 35 U.S.C. 154(b) by 27 days.

(21) Appl. No.: 17/388,028

(22) Filed: Jul. 29, 2021

(65) Prior Publication Data

US 2022/0354030 A1 Nov. 3, 2022

(30) Foreign Application Priority Data

Apr. 28, 2021 (TW) ................................ 110115346

(51) Int. Cl.
*H05K 7/20* (2006.01)
(52) U.S. Cl.
CPC ....... *H05K 7/20972* (2013.01); *H05K 7/2099* (2013.01); *H05K 7/20163* (2013.01); *H05K 7/20336* (2013.01); *H05K 7/20963* (2013.01)
(58) Field of Classification Search
CPC ................................................ H05K 7/20972
See application file for complete search history.

(56) References Cited

U.S. PATENT DOCUMENTS

| | | | |
|---|---|---|---|
| 6,833,674 B2* | 12/2004 | Kaneko .............. | H05K 7/20963 313/46 |
| 7,164,586 B2* | 1/2007 | Lin ..................... | H05K 7/20972 348/794 |
| 7,667,964 B2* | 2/2010 | Kang ................. | G02F 1/133308 313/582 |
| 8,649,176 B2* | 2/2014 | Okada ................ | H05K 7/20972 361/679.5 |
| 8,693,185 B2* | 4/2014 | Dunn .................. | H05K 7/20972 361/679.48 |
| RE45,117 E * | 9/2014 | Kang ................. | G02F 1/133308 361/679.48 |
| 10,314,212 B2* | 6/2019 | Hubbard ........... | G02F 1/133308 |

(Continued)

FOREIGN PATENT DOCUMENTS

| | | | | |
|---|---|---|---|---|
| CN | 103648258 A | 3/2014 | | |
| FR | 2891940 A1 * | 4/2007 | ....... | G02F 1/133385 |
| KR | 20210151440 A * | 12/2021 | ......... | H05K 7/20172 |

*Primary Examiner* — Robert J Hoffberg
(74) *Attorney, Agent, or Firm* — Winston Hsu

(57) ABSTRACT

A heat dissipating mechanism is for heat dissipation of a display module and a heat generating module of a display apparatus and includes a frame structure, a first airflow generating device, and a conductive cover structure having first, second, and third covers. The first cover is connected to the frame structure for containing the display module. The second cover has an air inlet and an air outlet and is connected to the first cover to form a channel. The third cover is connected to the second cover for containing the heat generating module. The first airflow generating device is disposed in the air inlet to guide air into the channel and out of the air outlet, so as to form an airflow for heat dissipation of the display module and the heat generating module.

19 Claims, 4 Drawing Sheets

(56) References Cited

U.S. PATENT DOCUMENTS

| | | | |
|---|---|---|---|
| 11,054,693 B2 * | 7/2021 | Teragawa | G02F 1/133385 |
| 2009/0231808 A1 * | 9/2009 | Burgner | H05K 7/20972 |
| | | | 361/679.01 |

* cited by examiner

HEAT DISSIPATING MECHANISM AND DISPLAY APPARATUS THEREOF

BACKGROUND OF THE INVENTION

1. Field of the Invention

The present disclosure relates to a heat dissipating mechanism and a display apparatus thereof, and more specifically, to a heat dissipating mechanism utilizing covers to form a channel and utilizing an airflow generating device to generate an airflow in the channel for heat dissipation of a display module and a heat generating module and a display apparatus thereof.

2. Description of the Prior Art

Since a display apparatus mounted in the outdoor environment usually needs to have waterproof and dustproof functions for working properly, an enclosed casing design is applied to the display apparatus. That is, major electronic components (e.g. a display panel module and a control circuit module) in the display apparatus are disposed in an enclosed space formed by a front frame, a transparent glass and a cover, so as to surely prevent foreign objects (e.g. water and dust) from entering the display apparatus to cause the short circuit or rustiness problem.

However, since heat energy generated by the electronic components of the display apparatus is accumulated in the enclosed space and cannot be dissipated out of the enclosed space quickly, it may cause crash or even damage of the electronic components easily when the temperature in the enclosed space is too high, so as to greatly influence the use safety, working stability, and service time of the display apparatus in the outdoor environment.

SUMMARY OF THE INVENTION

The present disclosure provides a heat dissipating mechanism for a display module and a heat generating module. The heat dissipating mechanism includes a frame structure, a conductive cover structure, and a first airflow generating device. The conductive cover structure has a first cover, a second cover, and a third cover. The first cover is connected to the frame structure for cooperatively forming a first space. The display module is contained in the first space. The second cover has an air inlet and an air outlet and is connected to the first cover for cooperatively forming a channel. The third cover is connected to the second cover for cooperatively forming a second space. The heat generating module is contained in the second space. The first airflow generating device is disposed in one of the air inlet and the air outlet.

The present disclosure further provides a display apparatus including a display module, a heat generating module, and a heat dissipating mechanism. The heat generating module is electrically connected to the display module. The heat dissipating mechanism includes a frame structure, a conductive cover structure, and a first airflow generating device. The conductive cover structure has a first cover, a second cover, and a third cover. The first cover is connected to the frame structure for cooperatively forming a first space. The display module is contained in the first space. The second cover has an air inlet and an air outlet and is connected to the first cover for cooperatively forming a channel. The third cover is connected to the second cover for cooperatively forming a second space. The heat generating module is contained in the second space. The first airflow generating device is disposed in one of the air inlet and the air outlet.

These and other objectives of the present disclosure will no doubt become obvious to those of ordinary skill in the art after reading the following detailed description of the preferred embodiment that is illustrated in the various figures and drawings.

DETAILED DESCRIPTION

Figure 1:
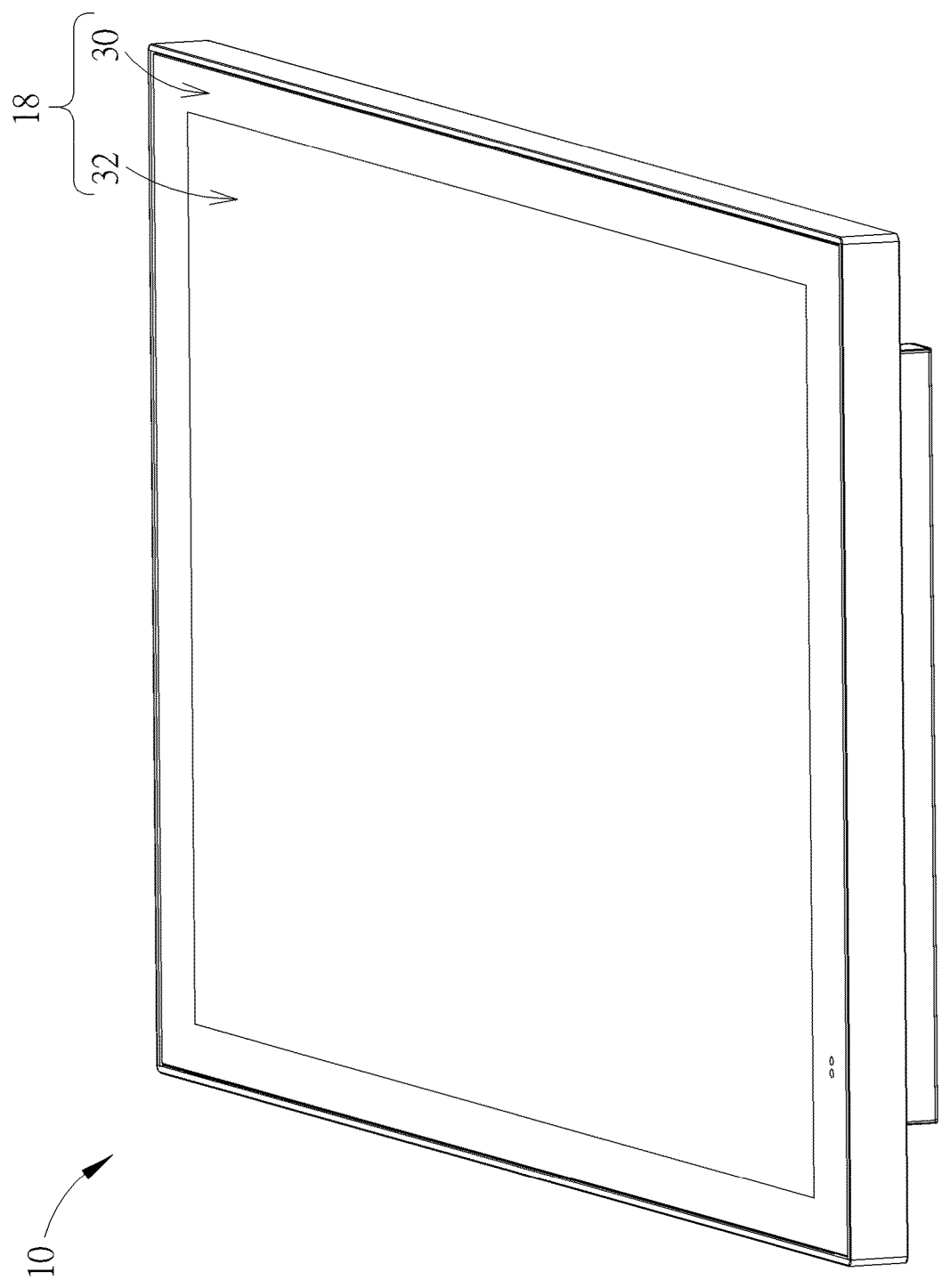
FIG. 1 is a diagram of a display apparatus according to an embodiment of the present disclosure.
Figure 2:
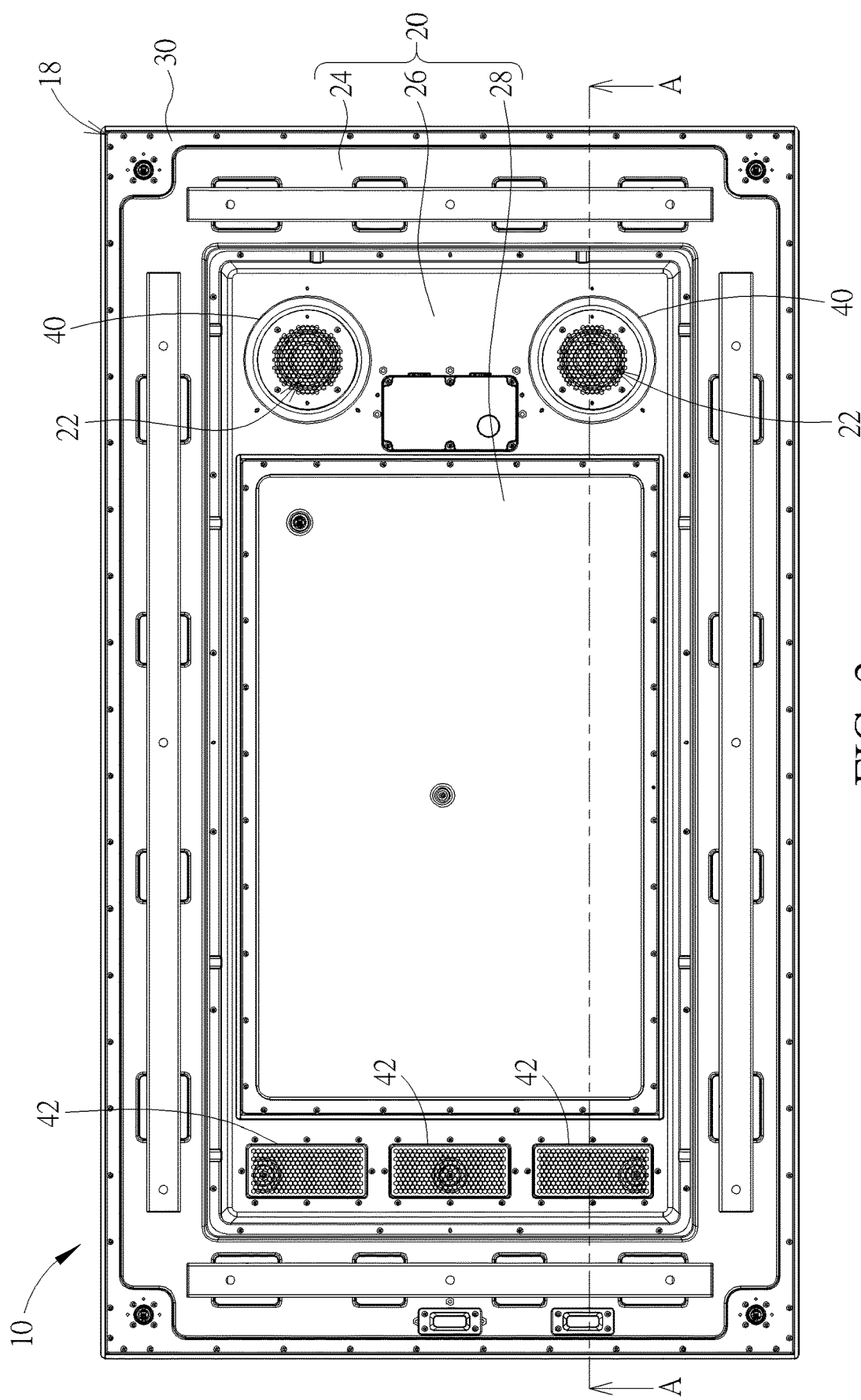
FIG. 2 is a back view of the display apparatus in FIG. 1.
Figure 3:
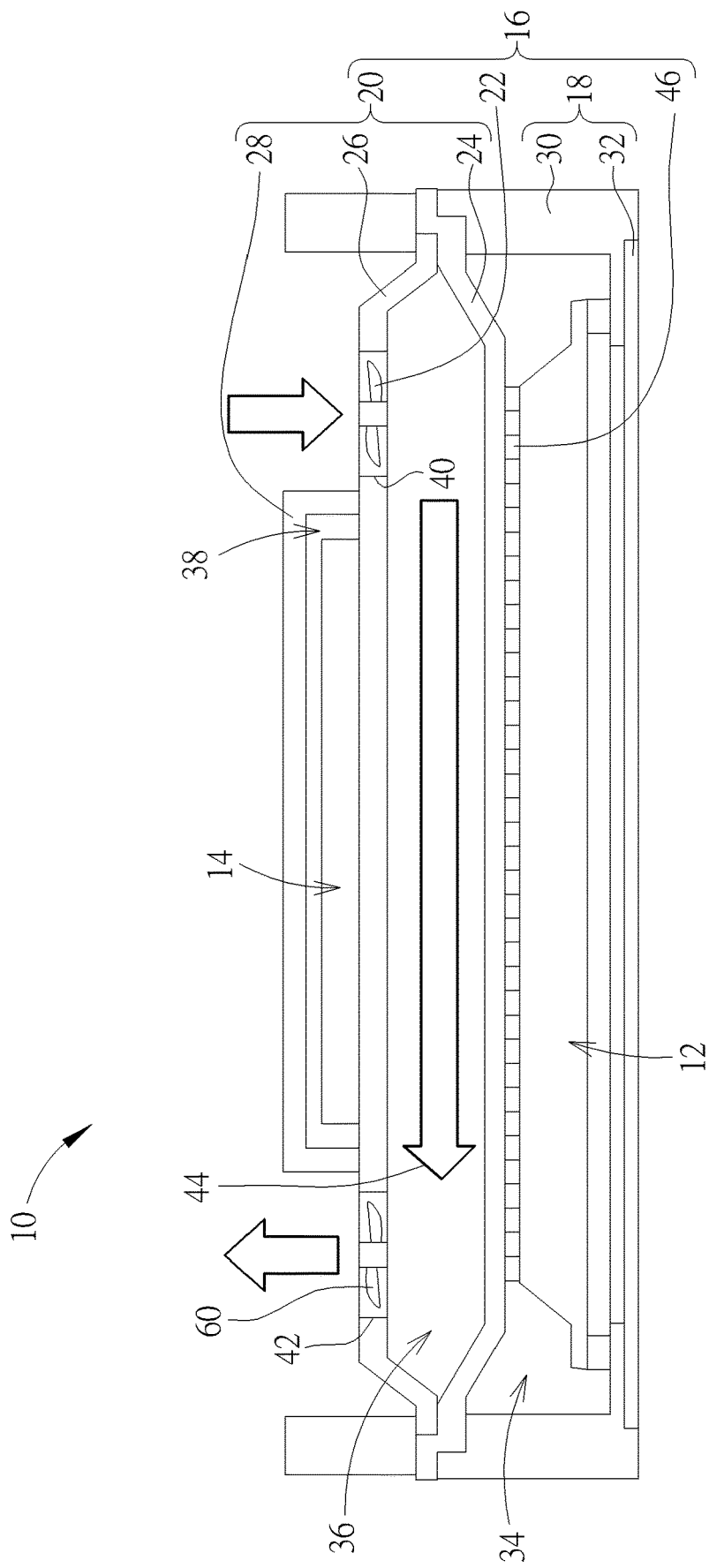
FIG. 3 is a cross-sectional diagram of the display apparatus in FIG. 2 along a cross-sectional line A-A.

Please refer to FIG. 1, FIG. 2, and FIG. 3. FIG. 1 is a diagram of a display apparatus 10 according to an embodiment of the present disclosure. FIG. 2 is a back view of the display apparatus 10 in FIG. 1. FIG. 3 is a cross-sectional diagram of the display apparatus 10 in FIG. 2 along a cross-sectional line A-A. As shown in FIG. 1, FIG. 2, and FIG. 3, the display apparatus 10 includes a display module 12, a heat generating module 14, and a heat dissipating mechanism 16. For clearly showing the heat dissipating design of the display apparatus 10, the casing structure and the related module configuration of the display apparatus 10 are depicted by simple lines in FIG. 3, but the present disclosure is not limited thereto. The display module 12 could be a panel device (e.g. an LCM (Liquid Crystal Display Module), but the present disclosure is not limited thereto) commonly applied to image display and could include related display components (e.g. a light source, a glass array substrate, and a liquid crystal layer). The heat generating module 14 could be preferably a circuit board module commonly applied to image display control (but the present disclosure is not limited thereto) and electrically connected to the display module 12. The circuit board module could include related display components (e.g. a motherboard, a central processing unit, a power supply, and a power adaptor) for controlling image display of the display module 12. As for the related description for the display module 12 and the heat generating module 14 (e.g. the circuit layout design or the control circuit design), it could be commonly seen in the prior art and omitted herein.

As shown in FIG. 2 and FIG. 3, the heat dissipating mechanism 16 includes a frame structure 18, a conductive cover structure 20 (preferably made of aluminum material, but the present disclosure is not limited thereto), and at least one first airflow generating device 22 (two fans shown in FIG. 2, but the present disclosure is not limited thereto). The conductive cover structure 20 includes a first cover 24, a second cover 26, and a third cover 28, and the first cover 24 and the second cover are conductive covers. The frame structure 18 could preferably adopt a frame design commonly applied to a display apparatus for containing the display module 12 and the heat generating module 14 cooperatively with the first cover 24, the second cover 26, and the third cover 28. For example, in this embodiment, the frame structure 18 includes a front frame 30 and a transparent glass 32. The front frame 30 is connected to the first cover 24 and the transparent glass 32 is connected to the front frame 30, so that the first cover 24, the front frame 30 and the transparent glass 32 can cooperatively form the first space 34 for containing the display module 12. The first space 34 could be preferably an enclosed space. For example, the front frame 30 could be connected to the first cover 24 and the transparent glass 32 by a glue sealing method (but not limited thereto), so as to provide waterproof and dustproof functions to the display module 12 disposed in the first space 34.

Similarly, the second cover 26 is connected to the first cover and the third cover 28. Accordingly, the second cover 26 and the first cover 24 can cooperatively form a channel 36 for allowing a heat dissipating airflow to pass therethrough, and the second cover 26 and the third cover 28 can cooperatively form a second space 38 for containing the heat generating module 14. The channel 36 could preferably separate the first space 34 from the second space 38 for preventing heat accumulation. The second space 38 could be preferably an enclosed space. For example, the second cover 26 could be connected to the third cover 28 by a glue sealing method (but the present disclosure is not limited thereto), so as to provide waterproof and dustproof functions to the heat generating module 14 disposed in the second space 38. Furthermore, in this embodiment, as shown in FIG. 3, at least one portion of the first cover 24 could preferably protrude toward the display module 12 and at least one portion of the second cover 26 could preferably protrude toward the heat generating module 14 (but the present disclosure is not limited thereto), so as to expand the width of the channel 36 for increasing the volume of the heat dissipating airflow to improve the heat dissipating efficiency of the heat dissipating mechanism 16.

As shown in FIG. 2 and FIG. 3, the second cover 26 has at least one air inlet 40 (two shown in FIG. 2, but the present disclosure is not limited thereto) and at least one air outlet 42 (three shown in FIG. 2, but the present disclosure is not limited thereto). The first airflow generating device 22 is disposed in the air inlet 40 (but the present disclosure is not limited thereto, meaning that the first airflow generating device 22 could be disposed in the air outlet 42 to guide air to flow out of the air outlet 42 in another embodiment). Accordingly, the first airflow generating device 22 could be used to guide air from the air inlet 40 into the channel 36 and out of the air outlet 42 for forming an airflow 44. Via thermal conductivity of the first cover 24 and the second cover 26, heat energy generated by the display module 12 and the heat generating module 14 can be conducted to the channel 36 via the first cover 24 and the second cover 26 respectively, and then can be taken out of the air outlet 42 by the airflow 44, so as to achieve the effect that the accumulated heat energy can be dissipated out of the first space 34 and the second space 38 quickly.

Via the design in which the display module and the heat generating module are respectively disposed in the different spaces formed by the aforesaid covers and the front frame and the airflow is generated in the channel located between the aforesaid covers via rotation of the airflow generating device, the present disclosure not only prevents accumulation of the heat energy generated by the electronic components in the display apparatus, but efficiently solves the prior art problem that the heat energy cannot be dissipated out of the enclosed space quickly, so as to surely prevent crash or even damage of the electronic components caused by the excessively high temperature in the enclosed space. Thus, the present disclosure can greatly improve the use safety, working stability, and service time of the display apparatus in the outdoor environment.

Figure 4:
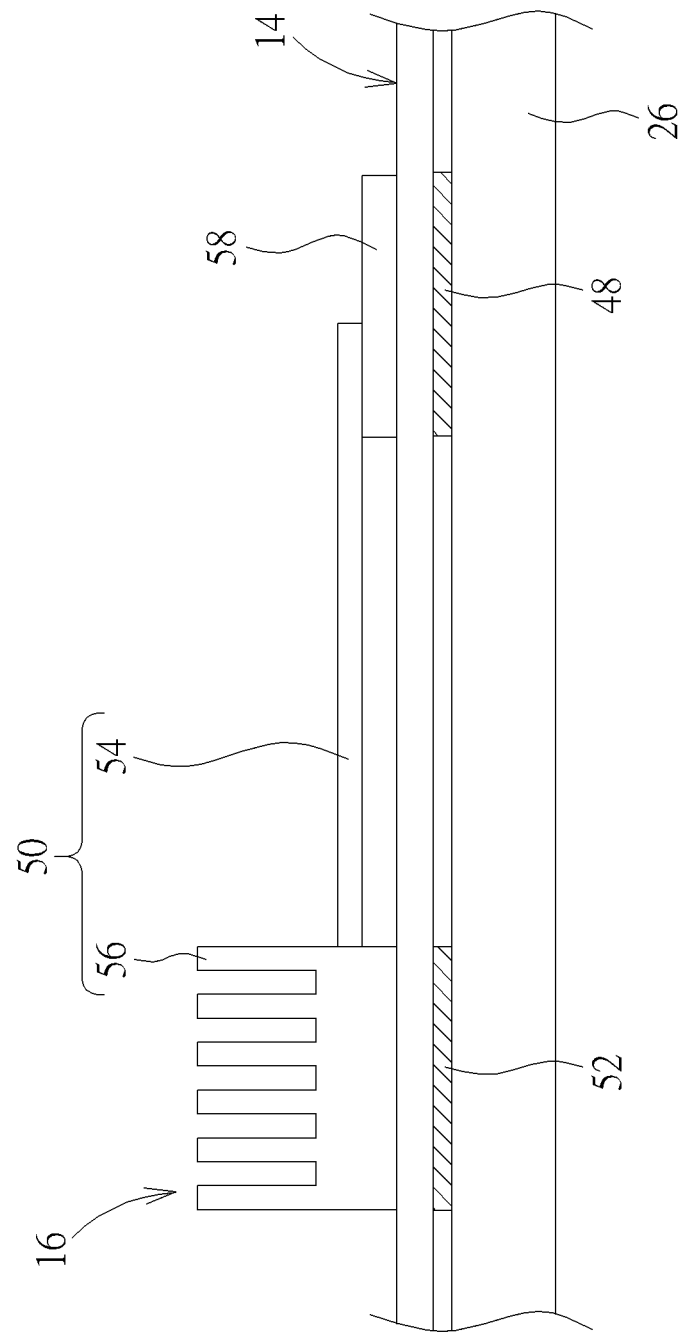
FIG. 4 is a partial enlarged diagram of a heat generating module in FIG. 3.

It should be mentioned that the present disclosure could utilize a thermally-conductive pad for improving the efficiency of conducting the heat energy to the airflow. For example, please refer to FIG. 3 and FIG. 4. FIG. 4 is a partial enlarged diagram of the heat generating module 14 in FIG. 3. For clearly showing the thermal conducting design of the heat generating module 14, the related component configuration of the heat generating module 14 is depicted by simple lines in FIG. 4, but the present disclosure is not limited thereto. As shown in FIG. 3, the heat dissipating mechanism 16 could further include at least one thermally-conductive pad 46 (nineteen shown in FIG. 3, but the present disclosure is not limited thereto). The thermally-conductive pad 46 could be preferably made of material having high thermal conductivity (e.g. thermally-conductive silicone rubber) and attached between the display module 12 and the first cover 24. Specifically, the thermally-conductive pad 46 is attached to a position corresponding to a heat generating component (e.g. an LED (Light Emitting Diode) bar) in the display module 12 for conducting the heat energy generated by the display module 12 to the first cover 24 quickly, such that the heat energy can be taken away by the airflow 44. Moreover, as shown in FIG. 4, the heat dissipating mechanism 16 could further include at least one thermally-conductive pad 48 (one shown in FIG. 4, but the present disclosure is not limited thereto). The thermally-conductive pad 48 could be preferably made of material having high thermal conductivity (e.g. thermally-conductive silicone rubber) and attached between the heat generating module 14 and the second cover 26. Specifically, the thermally-conductive pad 48 is attached to a position corresponding to a heat generating component (e.g. a central processing unit, a high power supply, or a power adaptor) in the heat generating module 14 for conducting the heat energy generated by the heat generating module 14 to the second cover 26 quickly, such that the heat energy can be taken away by the airflow 44.

In practical application, the present disclosure could further adopt the design that a thermally-conductive pad is attached to a position corresponding to a heat dissipating device in the display apparatus 10. For example, as shown in FIG. 4, the heat dissipating mechanism 16 could further include a heat pipe structure 50 and at least one thermally-conductive pad 52 (one shown in FIG. 4, but the present disclosure is not limited thereto). The heat pipe structure 50 has a heat pipe 54 and a heat dissipating fin 56. The heat pipe 54 is connected to the heat dissipating fin 56 and a heat source 58 (e.g. a central processing unit, a high power supply, or a power adaptor) of the heat generating module 14, and the thermally-conductive pad 52 is disposed between the heat dissipating fin 56 and the second cover 26. Accordingly, the heat pipe 54 can conduct the heat energy generated by the heat source 58 to the heat dissipating fin 56 for heat dissipation. At the same time, the thermally-conductive pad 52 attached under the heat dissipating fin 56 can conduct the heat energy to the second cover 26 quickly, and then the heat energy can be taken away by the airflow 44, so as to further improve the heat dissipating efficiency of the heat dissipating mechanism 16.

In addition, the present disclosure could adopt the design that the air outlet has another airflow generating device disposed therein. For example, as shown in FIG. 3, the heat dissipating mechanism 16 could further include a second airflow generating device 60 (preferably a fan, but the present invention is not limited thereto). The second airflow generating device 60 is disposed in the air outlet 42 (but the present disclosure is not limited thereto, meaning that the present disclosure could adopt the design that the first airflow generating device 22 is disposed in the air outlet 42 and the second airflow generating device 60 is disposed in the air inlet 40 in another embodiment). Accordingly, the second airflow generating device 60 can guide air in the channel 36 to flow out of the air outlet 42 more quickly for improving the flow rate of the airflow 44, so as to improve the heat dissipating efficiency of the heat dissipating mechanism 16. To be noted, after the display apparatus 10 is working over a period of time, the display apparatus 10 could operably control the first airflow generating device 22 and the second airflow generating device 60 to rotate reversely. As such, the first airflow generating device 22 and the second airflow generating device 60 can guide air to flow into the channel 36 via the air outlet 42 and then flow out of the air inlet 40, so as to form a reverse airflow in the channel 36 for blowing foreign objects (e.g. dust) accumulated in the air inlet 40 out of the display apparatus 10. In such a manner, the dust removing effect can be achieved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A heat dissipating mechanism for a display module and a heat generating module, the heat dissipating mechanism comprising:
a frame structure;
a conductive cover structure having a first cover, a second cover, and a third cover, the first cover and the second cover being conductive covers, the first cover being connected to the frame structure for cooperatively forming a first space, the display module being contained in the first space, the second cover having an air inlet and an air outlet and being connected to the first cover for cooperatively forming a channel, the third cover being connected to the second cover for cooperatively forming a second space, the third cover and the second space being located on a side of the second cover that is away from the first cover, the heat generating module being contained in the second space; and
a first airflow generating device disposed in one of the air inlet and the air outlet.

2. The heat dissipating mechanism of claim 1, wherein the frame structure comprises a front frame and a transparent glass, and the transparent glass is connected to the front frame for forming the first space cooperatively with the front frame and the first cover.

3. The heat dissipating mechanism of claim 1 further comprising:
at least one thermally-conductive pad attached between the display module and the first cover for conducting heat energy generated by the display module to the first cover.

4. The heat dissipating mechanism of claim 1 further comprising:
at least one thermally-conductive pad attached between the heat generating module and the second cover for conducting heat energy generated by the heat generating module to the second cover.

5. The heat dissipating mechanism of claim 1 further comprising:
a second airflow generating device disposed in another of the air inlet and the air outlet for guiding air to flow out of the air outlet.

6. The heat dissipating mechanism of claim 1 further comprising:
a heat pipe structure having a heat pipe and a heat dissipating fin, the heat pipe being connected between a heat source of the heat generating module and the heat dissipating fin; and
at least one thermally-conductive pad disposed between the heat dissipating fin and the second cover.

7. The heat dissipating mechanism of claim 1, wherein the first airflow generating device is operable to rotate reversely for guiding air from the air outlet into the channel and out of the air inlet, so as to form a reverse airflow in the channel.

8. The heat dissipating mechanism of claim 1, wherein at least one portion of the first cover protrudes toward the display module, and at least one portion of the second cover protrudes toward the heat generating module.

9. The heat dissipating mechanism of claim 1, wherein the first space and the second space are enclosed spaces separately.

10. A display apparatus comprising:
a display module;
a heat generating module electrically connected to the display module; and
a heat dissipating mechanism comprising:
a frame structure;
a conductive cover structure having a first cover, a second cover, and a third cover, the first cover and the second cover being conductive covers, the first cover being connected to the frame structure for cooperatively forming a first space, the display module being contained in the first space, the second cover having an air inlet and an air outlet and being connected to the first cover for cooperatively forming a channel, the third cover being connected to the second cover for cooperatively forming a second space, the third cover and the second space being located on a side of the second cover that is away from the first cover, the heat generating module being contained in the second space; and
a first airflow generating device disposed in one of the air inlet and the air outlet.

11. The display apparatus of claim 10, wherein the frame structure comprises a front frame and a transparent glass, and the transparent glass is connected to the front frame for forming the first space cooperatively with the front frame and the first cover.

12. The display apparatus of claim 10, wherein the heat dissipating mechanism further comprises:
at least one thermally-conductive pad attached between the display module and the first cover for conducting heat energy generated by the display module to the first cover.

13. The display apparatus of claim 10, wherein the heat dissipating mechanism further comprises:
at least one thermally-conductive pad attached between the heat generating module and the second cover for conducting heat energy generated by the heat generating module to the second cover.

14. The display apparatus of claim 10, wherein the heat dissipating mechanism further comprises:
a second airflow generating device disposed in another of the air inlet and the air outlet for guiding air to flow out of the air outlet.

15. The display apparatus of claim 10, wherein the heat dissipating mechanism further comprises:

a heat pipe structure having a heat pipe and a heat dissipating fin, the heat pipe being connected between a heat source of the heat generating module and the heat dissipating fin; and at least one thermally-conductive pad disposed between the heat dissipating fin and the second cover.

16. The display apparatus of claim 10, wherein the first airflow generating device is operable to rotate reversely for guiding air from the air outlet into the channel and out of the air inlet, so as to form a reverse airflow in the channel.

17. The display apparatus of claim 10, wherein at least one portion of the first cover protrudes toward the display module, and at least one portion of the second cover protrudes toward the heat generating module.

18. The display apparatus of claim 10, wherein the heat generating module is a circuit board module, and the circuit board module is electrically connected to the display module for controlling image display of the display module.

19. The display apparatus of claim 10, wherein the first space and the second space are enclosed spaces separately.

* * * * *